United States Patent [19]
Hamada

[11] Patent Number: 5,970,076
[45] Date of Patent: Oct. 19, 1999

[54] WAVELENGTH TUNABLE SEMICONDUCTOR LASER LIGHT SOURCE

[75] Inventor: Madoka Hamada, Tokyo, Japan

[73] Assignee: Ando Electric Co., Ltd., Tokyo, Japan

[21] Appl. No.: 09/045,643

[22] Filed: Mar. 23, 1998

[30] Foreign Application Priority Data

Mar. 24, 1997 [JP] Japan ..................................... 9-070083

[51] Int. Cl.⁶ ..................................................... H01S 3/10
[52] U.S. Cl. .............................. 372/20; 372/102; 372/98; 372/33; 372/20
[58] Field of Search .............................. 372/20, 102, 98, 372/29, 33, 92

[56] References Cited

U.S. PATENT DOCUMENTS

| | | | |
|---|---|---|---|
| 4,977,564 | 12/1990 | Ryu et al. | 372/32 |
| 5,442,651 | 8/1995 | Maeda | 372/20 |
| 5,493,575 | 2/1996 | Kitamura | 372/20 |

Primary Examiner—Leon Scott, Jr.
Attorney, Agent, or Firm—Pillsbury, Madison & Sutro LLP

[57] ABSTRACT

A wavelength tunable semiconductor laser light source, which has an external resonator semiconductor laser source unit; an optical filter for selecting an output beam of the external resonator semiconductor laser source unit in a single mode; a drive unit for changing wavelength of a transmitted beam or of a reflected beam, from the optical filter; and a control unit for controlling the drive unit; a first beam splitting device for receiving the output beam of the external resonator semiconductor laser source unit as one of incident beams and for outputting it into two branches; an etalon for receiving one of output beams from the first beam splitting device; a measuring unit for etalon transmittance, for measuring a transmittance of the etalon to transmit it to the control unit; and a wavemeter for specifying a wavelength of the output beam of the semiconductor laser source unit with an accuracy in a free spectral range of the etalon, on the basis of the output beam of the semiconductor laser source unit or on the basis of information from the drive unit, to output the specified wavelength to the control unit.

7 Claims, 9 Drawing Sheets

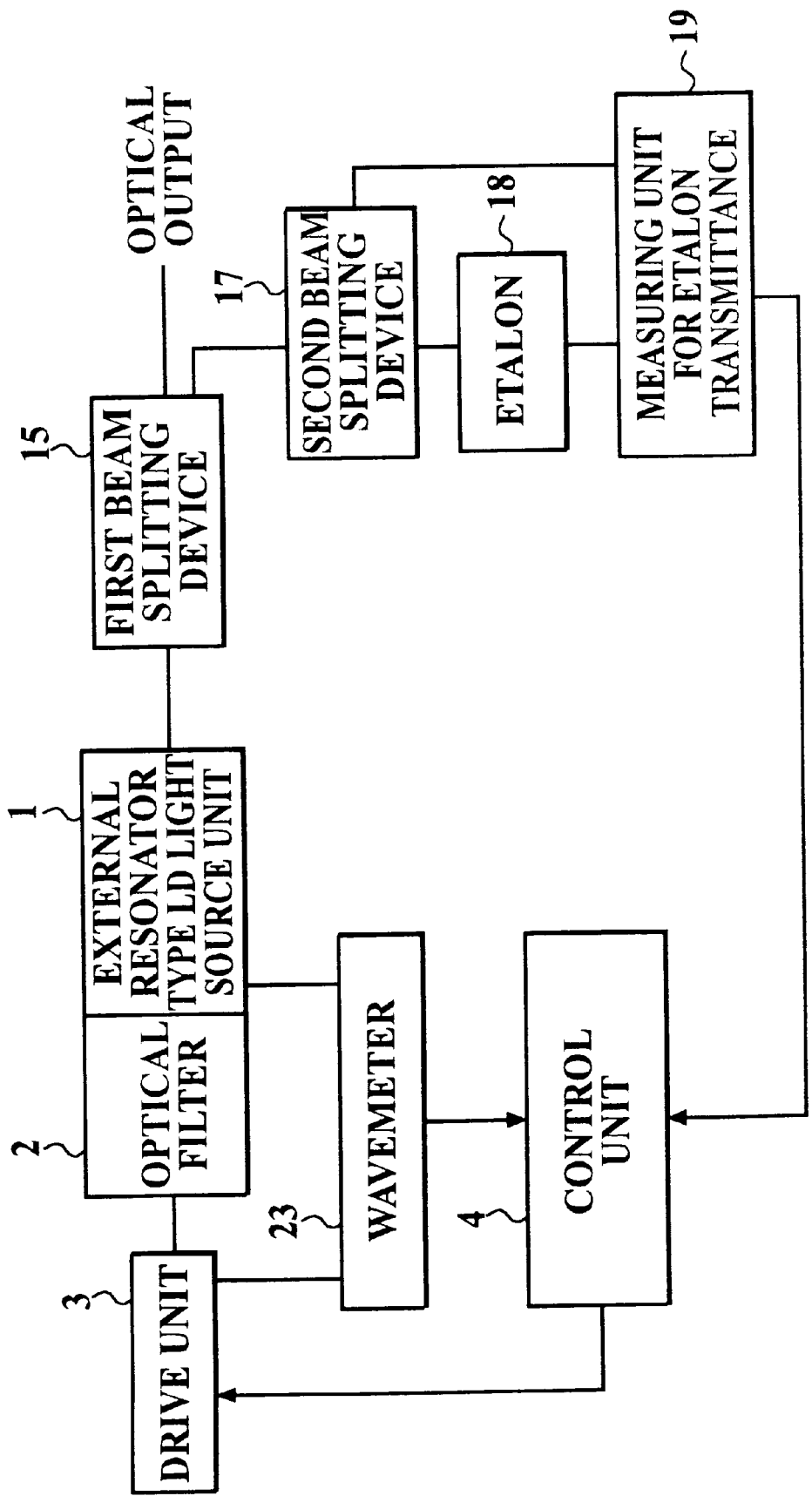

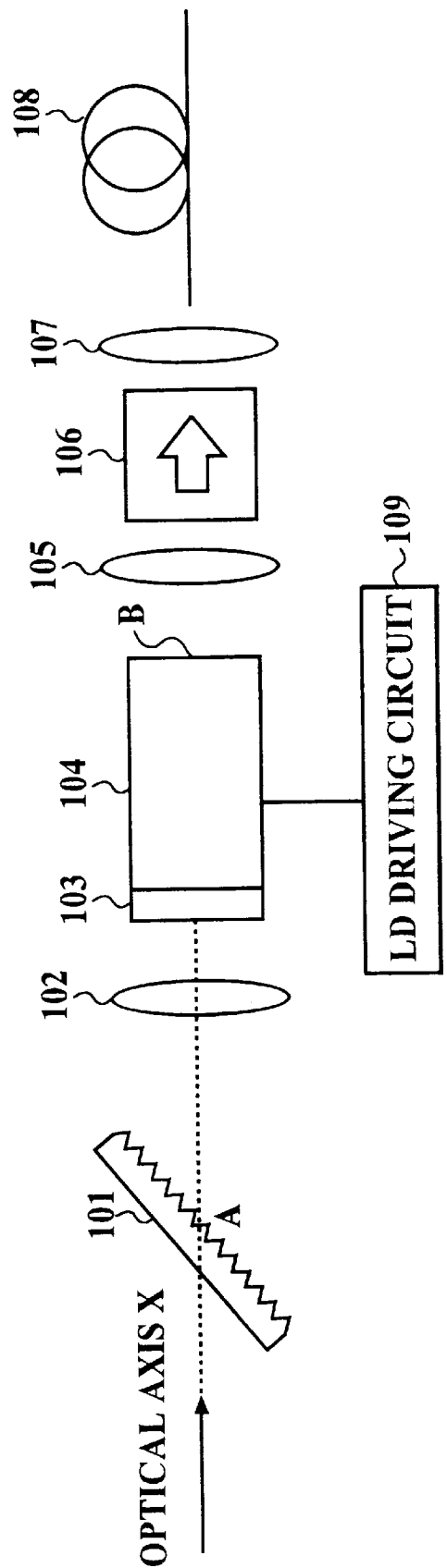

WAVELENGTH TUNABLE SEMICONDUCTOR LASER LIGHT SOURCE

BACKGROUND OF THE INVENTION

1. Field of the Invention

The present invention relates to a semiconductor laser light source tunable in wavelength, which is used in any technical field which requires a light signal source, in particular, in an optical telecommunication or a coherent optical measuring technical field.

2. Description of Related Art

In the coherent optical measuring technical field, an external resonator type of semiconductor laser (hereinafter, may be simply referred to LD) is generally used as a light source unit in a light source tunable in wavelength. An optical filter which is a wavelength selection element is disposed in the external resonator thereof to get a singlemode oscillation.

Such a technique enables wavelength scanning in a wide range by mechanically varying the transmitted (or reflected) wavelength from the optical filter.

FIG. 11 shows a construction example of a conventional wavelength tunable LD light source. In this figure, the reference numeral 1 denotes an external resonator type of LD light source unit, 2 denotes an optical filter, 3 denotes a drive unit, 4 denotes a control unit, and 20 denotes an origin switch.

In the wavelength tunable LD light source in FIG. 11, first, when a power source is turned on, the drive unit 3 is moved to a position at which the origin switch 20 is operated thereby, by the control unit 4. When the origin switch 20 is operated, the drive unit 3 is reset and the position thereof is used as the origin.

The wavelength of the output of the wavelength tunable LD light source when the drive unit 3 is at the origin is measured in advance by using a precise wavemeter and is memorized as the origin wavelength.

The drive unit 3 can mechanically change wavelength of the transmitted beam or of the reflected beam, from the optical filter 2, and when occasion demands, it carries out also adjustment for the length of an external resonator.

The relationship between the state of the drive unit 3 and the oscillation wavelength of the external resonator is already known. In the control unit 4, a wavelength set is carried out on the basis of a formula showing the known relationship. The control unit 4 also controls the LD drive current in order to control the optical output level of the LD light source unit 1.

FIG. 5 shows a construction example of an external resonator type of LD light source unit 1. In FIG 5, the reference numeral 101 denotes a diffraction grating; 102, 105 and 107 denote lenses; 103 denotes an anti-reflection film; 104 denotes an LD; 106 denotes an optical isolator; 108 denotes an optical fiber; and 109 denotes an LD driving circuit.

In the external resonator type of LD light source unit 1, shown in FIG. 5, the diffraction grating 101 which corresponds to the above-described optical filter 2, as shown in FIG. 4, also functions as a mirror in one side of the external resonator.

That is, the external resonator is formed by the end surface B of the LD and the diffraction grating 101. When denoting the intersection of the surface of the diffraction grating 101 and the optical axis X with A, the length of the resonator is defined by the segment AB of a line.

An anti-reflection film 103 is formed on an end surface in the side of the diffraction grating 101, of the LD 104 in order to remove unnecessary reflection.

Each of the lenses 102 and 105 is a collimator for changing the output beam of the LD 104 to a collimated beam.

The output beam from the external resonator LD 104, which is obtained from the side of the LD end surface B, is condensed through the lens 107 and is taken out by the optical fiber 108.

In order to generate no noise due to external feedback beam from a following optical system, the optical isolator 106 is disposed on the way in the output side.

The LD driving circuit 109 feeds an LD driving current corresponding to a desired optical output level.

Although only the diffraction grating 101 is shown in FIG. 5, as the optical filter 2, it is possible to use an optical element other than the diffraction grating 101, for example, to use an interference filter or the like, as the optical filter 2. When occasion demands, combination of a plurality of optical elements can be also used as the optical filter 2.

Next, the characteristics of an optical filter will be explained as follows.

FIG. 6 shows an optical system of a diffraction grating 101. In this FIG., $\theta$ is the angle of the normal $N_{gr}$ to the diffraction grating 101 with the optical axis, d is the pitch of the diffraction grating, and the incident light and the reflected (diffracted) light are set on the same optical axis X, like the above-described external resonator shown in FIG. 5.

The spectrum of the reflected light when an incident white light came into the diffraction grating 101 is the filter characteristics of the diffraction grating. A filter characteristics is obtained, as shown in FIG. 7.

The reflection peak wavelength $\lambda_{gr}$ is given by the following Bragg's formula:

$$\lambda_{gr} = 2d \times \sin(\theta) \quad (1)$$

The characteristics of the interference filter 201 in the optical system shown in FIG. 8 has periodic transmittance peaks, as shown in FIG. 9.

In FIG. 8, "D" is the thickness of the interference filter 201, and "n" is the refractive index thereof.

The wavelength of each transmittance peak is given by the following formula:

$$k\lambda_k = 2nD \times \cos(\theta) \quad (2)$$

where $\theta$ is the angle of the normal N to the interference filter 201 with the optical axis in the interference filter, and k is an integer.

When L is the length of the external resonator and m is an integer, like the case of an interference filter, the oscillation longitudinal mode of the external resonator is expressed as follows:

$$m\lambda_m = 2L \quad (3)$$

Next, an example of characteristics of wavelength tunable LD light source, using an optical filter comprising a combination of a diffraction grating and an interference filter is illustrated in FIGS. 10A to 10E.

FIG. 10A shows a gain characteristics of LD, which generally has a gain in a wavelength range not less than 100 nm.

FIG. 10B shows a resonator mode corresponding to the formula (3), which are oscillation longitudinal modes.

Several modes are selected by using the filter characteristics of the diffraction grating shown in FIG. 10C, among the oscillation modes.

Then, a single mode is selected by using the filter characteristics of the interference filter shown in FIG. 10D. As a result, a single mode oscillation is obtained, as shown in FIG. 10E.

By changing each of the characteristics shown in FIGS. 10B, 10C, and 10D, that is, by changing L, θ, and φ suitably, it is possible to carry out wavelength scanning.

The relationship between the wavelength and L, θ, and φ is found on the basis of previous measurements. According to the relationship, the drive unit 3 having a combination of a motor, a rotary table, a directly linear-moving mechanism and the like realizes a state of particular values of L, θ, and φ, corresponding to the set wavelength.

The so-called WDM (Wavelength division multiplexing) of optical communication system which is recently focused on is one multiplexing several wavelengths with a difference of wavelengths of about 1 nm. For example, when the wavelengths difference is finely adjusted at a level of about 0.1 nm, wavelength accuracy having a level of about 0.01 nm which is taken a figure down in comparison with that of the wavelengths difference is required.

On the contrary, although the obtained set resolving power in the former art is a level of 0.001 nm, the set wavelength accuracy thereof is about a level of ±0.1 nm because of error factors, e.g., a backlash or a hysteresis on the mechanism, or set condition reproducibility including a fluctuation in temperature, a change with the passage of time or the like.

Therefore, in order to improve the set wavelength accuracy, it was required to prepare not only an external resonator type of wavelength tunable LD light source but also an expensive wavemeter, to measure the wavelength of the light source output by the wavemeter, and to correct the setting.

SUMMARY OF THE INVENTION

The present invention was developed in view of these problems.

An object of the invention is to provide a wavelength tunable LD light source which can assure a wavelength accuracy having a level of about ±0.01 nm.

That is, in accordance with one aspect of the present invention, the wavelength tunable semiconductor laser light source comprises; an external resonator type of semiconductor laser source unit; an optical filter for selecting an output beam of the external resonator type of semiconductor laser source unit in a single mode; a drive unit for changing wavelength of a transmitted beam or of a reflected beam, from the optical filter; a control unit for controlling the drive unit; an optical coupler for receiving the output beam of the external resonator type of semiconductor laser source unit as one of incident beams and for outputting it into two branches; a fiber grating for receiving an output beam from the optical coupler; a first etalon for receiving a reflected beam from the fiber grating through the optical coupler; a first measuring unit for etalon transmittance, for measuring a transmittance of the first etalon to transmit to the control unit; a second etalon for receiving the other of the two branched output beams of the optical coupler; and a second measuring unit for etalon transmittance, for measuring a transmittance of the second etalon to transmit to the control unit.

According to a wavelength tunable LD light source having such a construction, it is possible to set a wavelength optically while monitoring the output wavelength, by transmitting the transmittance of the first etalon and the transmittance of the second etalon, to the control unit and by adjusting the wavelength of a transmitted beam or of a reflected beam, from the optical filter of the external resonator type of semiconductor laser source unit.

Therefore, it is possible to prevent error factors on the mechanism from adverse effect to the set wavelength, and to assure a set wavelength accuracy having a level of about ±0.01 nm.

Preferably, the semiconductor laser light source further comprises; a first beam splitting device for receiving the reflected beam from the fiber grating through the optical coupler and for outputting it into two branches, one of which is output to the first etalon and the other is output to the first measuring unit for etalon transmittance, so that the first measuring unit for etalon transmittance compares a light intensity of transmitted beam through the first etalon with the other of output beams from the first beam splitting device to measure the transmittance of the first etalon; and a second beam splitting device for receiving the other of the two branched output beams of the optical coupler and for outputting it into two branches, one of which is output to the second etalon and the other is output to the second measuring unit for etalon transmittance, so that the second measuring unit for etalon transmittance compares a light intensity of transmitted beam through the second etalon with the other of output beams from the second beam splitting device to measure the transmittance of the second etalon.

According to the semiconductor laser light source having such a construction, because each of the first and second measuring units can compare a light intensity of transmitted beam through each etalon with the other of output beams from each beam splitting device to measure the transmittance of each etalon, it is possible to perform wavelength setting more precisely.

The first etalon may comprise an interference filter. Preferably, the first etalon has a free spectral range which is wider than a full width at half maximum of a reflection curve of the fiber grating. Accordingly, it is possible to make the light intensity of beam passed through the first etalon an approximate single mode.

Preferably, the facet of the first etalon has a reflectivity not less than 90%, in order to make the FWHM thereof narrower because the wavelength origin is determined by using the transmission spectrum of the first etalon.

In accordance with another aspect of the present invention, the semiconductor laser light source tunable in wavelength, comprises; an external resonator type of semiconductor laser source unit; an optical filter for selecting an output beam of the external resonator type of semiconductor laser source unit in a single mode; a drive unit for changing wavelength of a transmitted beam or of a reflected beam, from the optical filter; and a control unit for controlling the drive unit; a first beam splitting device for receiving the output beam of the external resonator type of semiconductor laser source unit as one of incident beams and for outputting it into two branches; an etalon for receiving one of output beams from the first beam splitting device; a measuring unit for etalon transmittance, for measuring a transmittance of the etalon to transmit it to the control unit; and a wavemeter for specifying a wavelength of the output beam of the semiconductor laser source unit with an accuracy in a free spectral range of the etalon, on the basis of the output beam of the semiconductor laser source unit or on the basis of information from the drive unit, to output the specified wavelength to the control unit.

According to a wavelength tunable LD light source having such a construction, it is possible to set a wavelength optically while monitoring the output wavelength, to prevent error factors on the mechanism from adverse effect to the set wavelength, and to assure a set wavelength accuracy having a level of about ±0.01 nm.

Preferably, the semiconductor laser light source tunable in wavelength further comprising; a second beam splitting device for receiving the one of output beams from the first beam splitting device and for outputting it into two branches, one of which is output to the etalon and the other is output to the measuring unit for etalon transmittance, so that the measuring unit for etalon transmittance compares a light intensity of transmitted beam through the etalon with the other of output beams from the second beam splitting device to measure the transmittance of the etalon.

BRIEF DESCRIPTION OF DRAWINGS

The present invention will become more fully understood from the detailed description given hereinbelow and the accompanying drawings which are given byway of illustration only, and thus are not intended as a definition of the limits of the present invention, and wherein;

FIGS. 2A to 2C are views for explaining of the principle of wavelength origin detection, in which FIG. 2A is a view showing a characteristics of wavelength-reflectivity, FIG. 2B is a view showing a characteristics of wavelength-transmittance, and FIG. 2C is a view showing a characteristics of wavelength-transmitted light intensity;

FIGS. 3A and 3B are views showing transmission characteristics of an etalon for setting wavelength, in which FIG. 3A is a view showing a characteristics of wavelength-transmittance, of the second etalon, FIG. 3B is a view showing a characteristics of wavelength-transmittance, of the first etalon;

FIG. 4 is a view showing a construction of the wavelength tunable LD light source according to another embodiment to which the invention is applied;

FIG. 5 is a view showing a construction example of the wavelength tunable LD light source;

FIGS. 10A to 10E are views for explaining of the principle of oscillation mode selection of the wavelength tunable LD light source having a combination of a diffraction grating and an interference filter, as an optical filter, in which FIG. 10A is a view showing a characteristics of wavelength-LD gain, FIG. 10B is a view showing a characteristics of wavelength-resonator mode, FIG. 10C is a view showing a characteristics of wavelength-grating reflectivity, FIG. 10D is a view showing a characteristics of wavelength-interference filter transmittance, and FIG. 10E is a view showing a characteristics of wavelength-oscillation mode.

PREFERRED EMBODIMENT OF THE INVENTION

An embodiment of the semiconductor laser (LD) light source tunable in wavelength according to the invention will be explained with reference to FIGS. 1 to 3, as follows.

Figure 1:
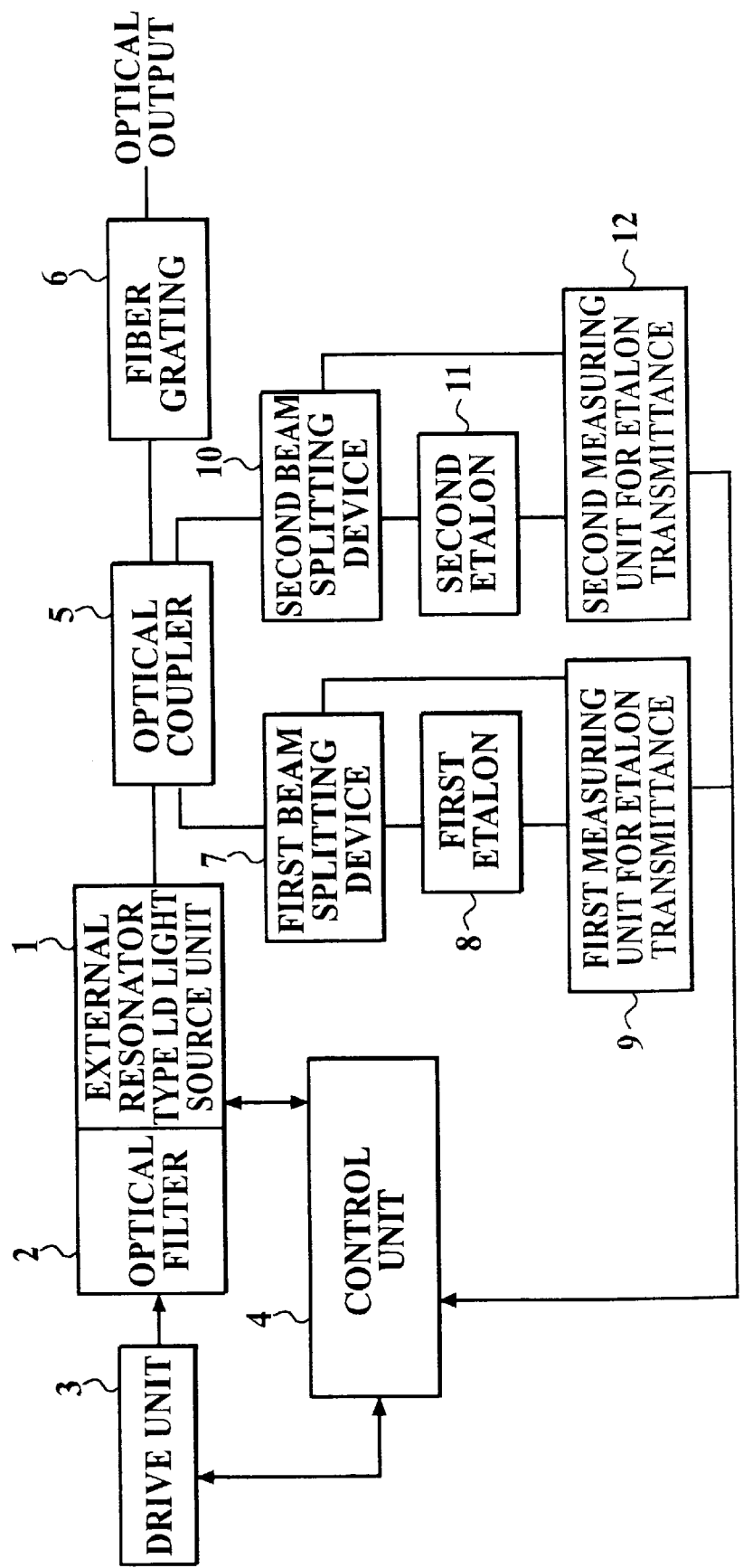
FIG. 1 is a view showing a construction of the wavelength tunable LD light source according to an embodiment to which the invention is applied.
Figure 11:
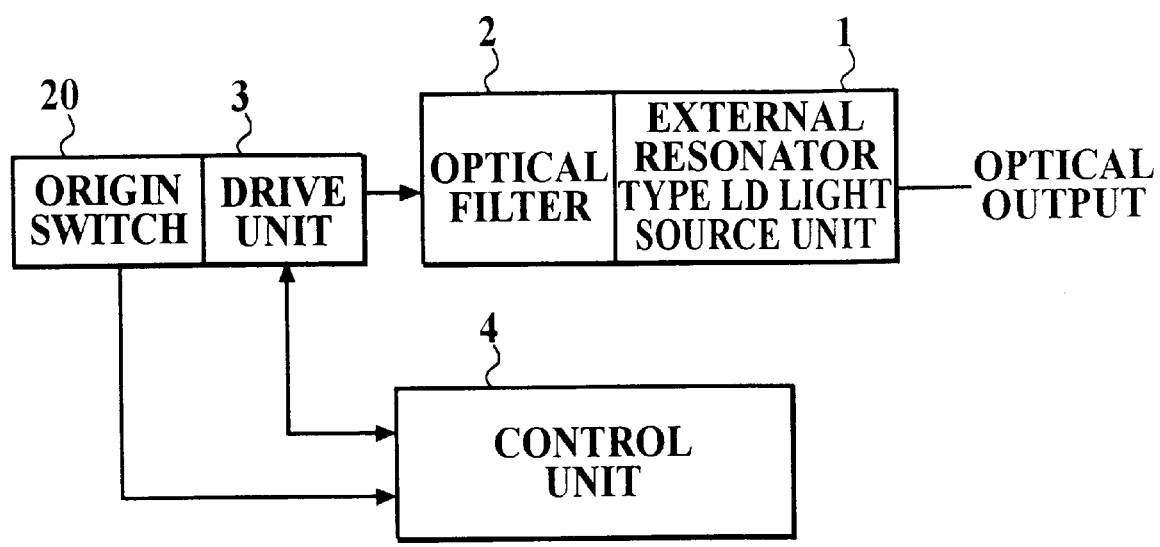
FIG. 11 is a view showing a construction of the wavelength tunable LD light source according to a prior art.

FIG. 1 is a block diagram for showing a construction of the wavelength tunable LD light source according to an embodiment of the invention. In this figure, the same elements and the like as corresponding ones in FIG. 11 have the same reference numerals, and the detailed explanation for them will be omitted.

In FIG. 1, the reference numeral 5 denotes an optical coupler, 6 denotes a fiber grating, 7 and 10 are first and second beam splitting devices, respectively, 8 and 11 are first and second etalons, respectively, and 9 and 12 are first and second measuring units for etalon transmittance, respectively.

The optical coupler 5 receives an output beam from the external resonator type of LD light source unit 1 as one input and produces branched two outputs. One of the two output beams branched at the optical coupler 5 is inputted into the fiber grating 6. The transmitted light of the fiber grating 6 is used as the output beam of the wavelength tunable LD light source.

The reflected light from the fiber grating 6 is inputted into the optical coupler 5 again and produces branched two outputs into the side of the external resonator type of LD light source unit 1. One of the branched two output lights is inputted into the first beam splitting device 7.

The first beam splitting device 7 splits the inputted light into two outputs. One of the two output lights splitted at the first beam splitting device 7 transmits the first etalon 8 and thereafter inputs into the first measuring unit 9 for the first etalon transmittance. The other of the two output lights splitted at the first beam splitting device 7 inputs into the first measuring unit 9 for etalon transmittance directly.

In the first measuring unit 9 for the first etalon transmittance, the transmitted light through the first etalon 8 and the direct inputted light from the first beam splitting device 7 are measured, and the ratio of intensities, i.e., the transmittance of the first etalon 8, is found. The result is sent to the control unit 4.

The other of the two output beams branched at the optical coupler 5, from the external resonator type of LD light source unit 1 is input to the second beam splitting device 10.

The second beam splitting device 10 outputs the input beam into two branches. One of the two output lights splitted at the second beam splitting device 10 transmits the second etalon 11 and thereafter inputs into the second measuring unit 12 for the second etalon transmittance. The other of output beams from the second beam splitting device 10 is input to the second measuring unit 12 for etalon transmittance directly.

In the second measuring unit 12 for etalon transmittance, the transmitted beam through the second etalon 11 and the direct beam input from the second beam splitting device 10 are measured, and the intensity ratio, that is, transmittance of the second etalon 11, is determined and transmitted to the control unit 4.

The control unit 4 gives an instruction to the drive unit 3 so that the value of transmittance data from the first and second measuring units 9 and 12 for etalon transmittance correspond to the wavelength origin and the position of set wavelength, on the basis of the relationship between etalon transmittance and wavelength which were measured by using a precise wavemeter and stored in advance.

Next, a method for detecting the wavelength origin will be explained with reference to FIG. 2.

The fiber grating 6 is a fiber type of optical filter. The index of refraction $n_f$ of the fiber core thereof periodically changes at a period $\Lambda$. The wavelength $\lambda_{fg}$ of reflectivity peak is given by the following formula:

$$\lambda_{fg} = 2n_f \Lambda \quad (4)$$

where the wavelength $\lambda_{fg}$ is set out of the range of output wavelength of the Wavelength tunable LD light source and therefore exerts no effect on the output level.

Figure 2A:
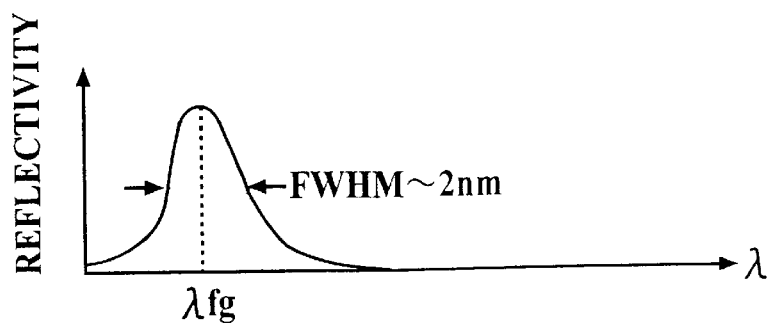

Although the full width at half maximum (hereinafter, it may be referred to FWHM) of the reflection curve of the fiber grating shown in FIG. 2A depends on the change of the index of refraction nf and the length of the changing region, it will be assumed to be 2 nm in the following explanation.

Figure 2B:
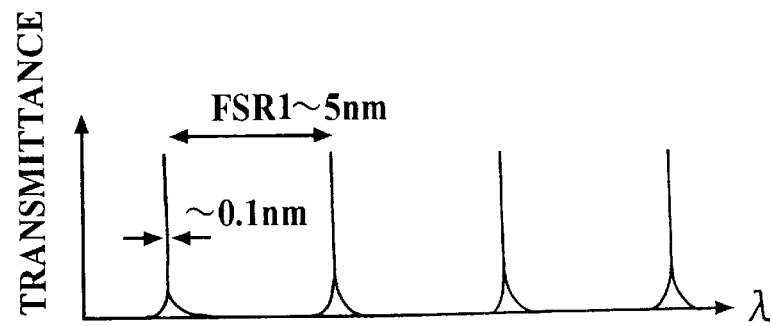

Next, the characteristics of transmittance of the first etalon 8 is shown in FIG. 2B.

Figure 8:
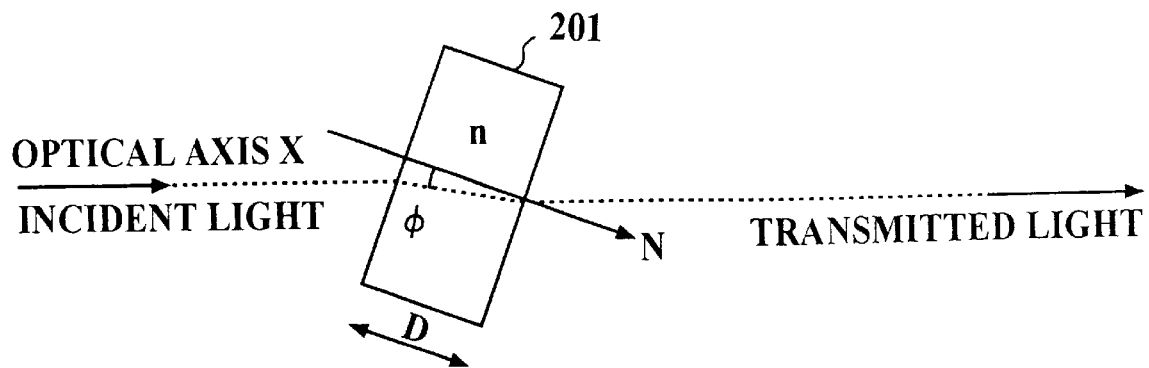
FIG. 8 is a view of an optical system of the interference filter, as an optical filter.
Figure 9:
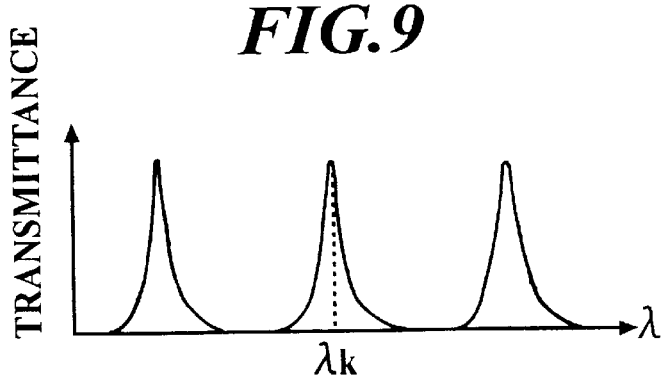
FIG. 9 is a view for showing a characteristics of wavelength-transmittance of the interference filter, as an optical filter.
Figure 10A:
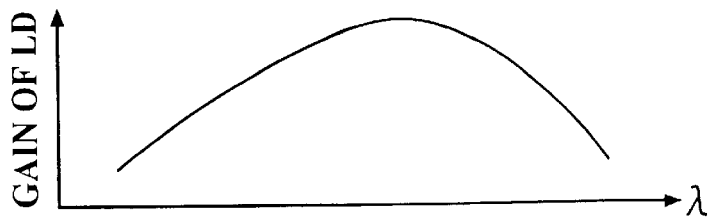
Figure 10B:
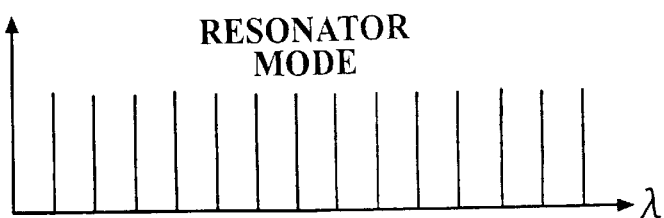
Figure 10C:
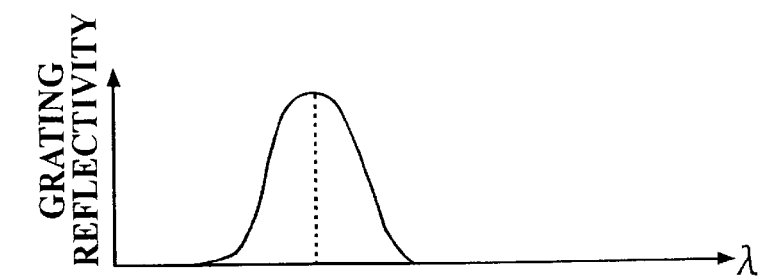
Figure 10D:
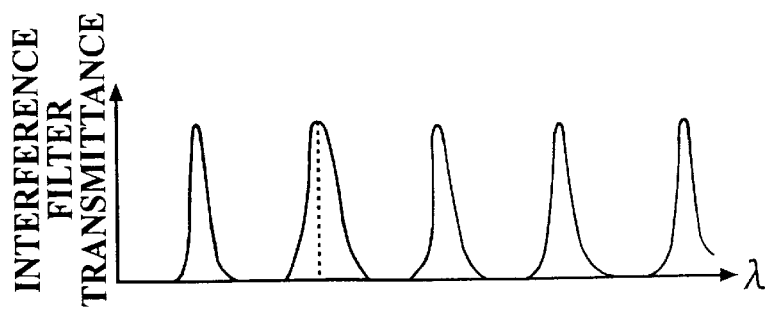
Figure 10E:
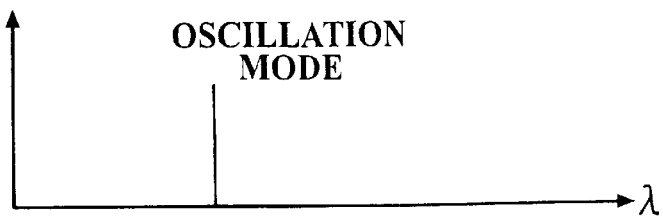

The etalon is an interference filter and FIGS. 8 and 9 and the above-described formula (2) can be referred for it.

The spacings between modes are called the free spectral range (hereinafter, it may be simply called FSR). An etalon having an FSR wider than FWHM of the reflection curve of the fiber grating shown in FIG. 2A, e.g., FSR1=5 nm, is used.

Figure 2C:
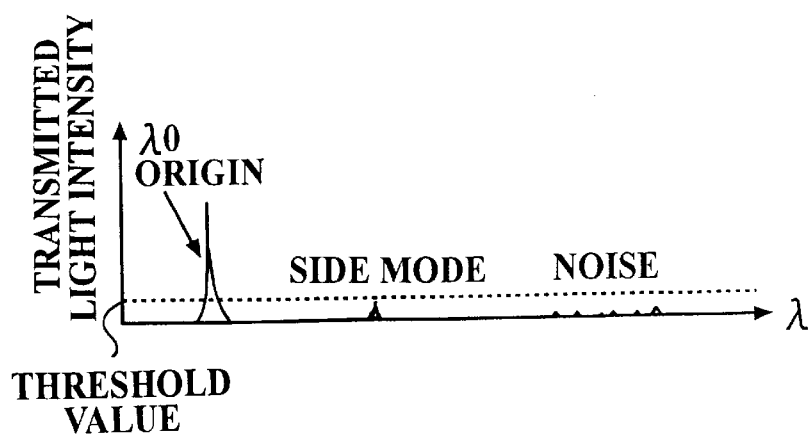

As the result, the light intensity passed through the first etalon 8 among the reflected beam from the fiber grating 6 comes to an approximate single mode, as shown in FIG. 2C.

It is preferable to make the FWHM thereof narrower because the wavelength origin is determined by using the transmission spectrum of the first etalon 8. Therefore, the facet of the first etalon 8 is formed to have a high reflectivity, e.g., not less than 90%.

Although the FWHM of the first etalon 8 is determined in consideration of the balance with the second etalon 11, it is preferable to be not more than 0.1 nm.

The wavelength origin is put at, for example, the point corresponding to 50% of the rising of transmittance curve in FIG. 2C. In order to remove side-modes, noise or the like, it is preferable to set a threshold value of the transmitted light intensity because of adoption of intensity ratio.

In the wavelength tunable LD light source according to the embodiment, when the power source is turned on, wavelength scanning is carried out by the drive unit 3. Thereby, the point corresponding to 50% in the rising of transmittance curve is found on the basis of the transmitted data from the first measuring unit 9 for the first etalon transmittance to determine the wavelength origin $\lambda_0$.

After determination of the wavelength origin $\lambda_0$, a shift to a desired wavelength to be set is carried out by using the transmission curve for the second etalon 11.

Figure 3A:
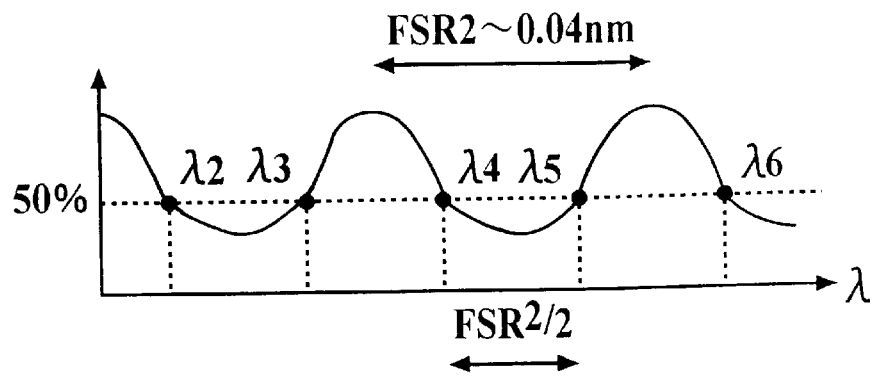

The transmittance of the second etalon 11 is shown in FIG. 3A.

The second etalon 11 having a facet reflectivity suppressed to approximately 27% gives a transmission curve having an approximate sine wave, as shown in this figure. The points corresponding to 50% of the transmittance curve for the second etalon 11 appear at wavelength intervals of about FSR2/2 repeatedly.

Because the incident light into the second etalon 11 is a part of the output light of the external resonator type of LD light source unit 1 without through a filter, such points corresponding to 50% of the transmittance curve can be obtained over the whole range of set wavelengths.

Even if setting of wavelength is performed to restrict to the points corresponding to 50% of the transmittance curve for the second etalon 11, for example, a design that FSR2= 0.04 nm enables setting of optical frequency at intervals of 0.02 nm. That is, a desired wavelength can be set within an error of ±0.01 nm.

The shift from the wavelength origin $\lambda_0$ detected at the first etalon 8 to a wavelength through the second etalon 11 is supposed to be, for example, one to $\lambda_4$ in FIG. 3.

Figure 3B:
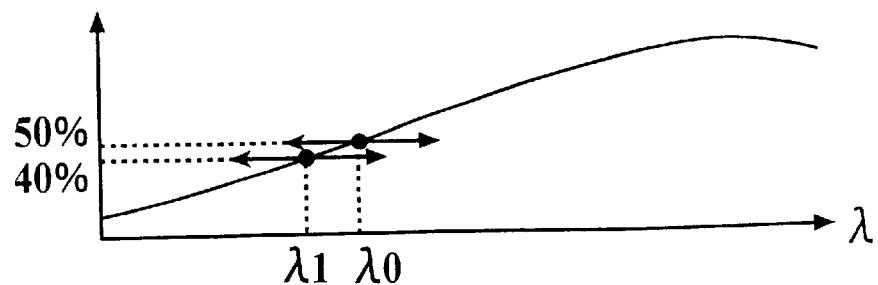
Figure 6:
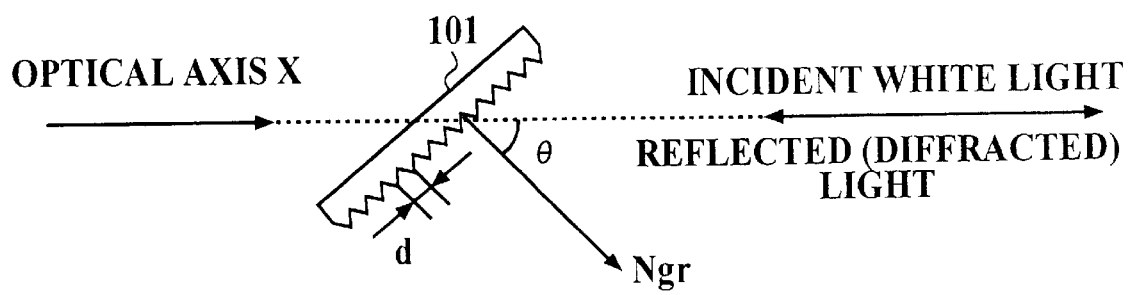
FIG. 6 is a view of an optical system of the diffraction grating.
Figure 7:
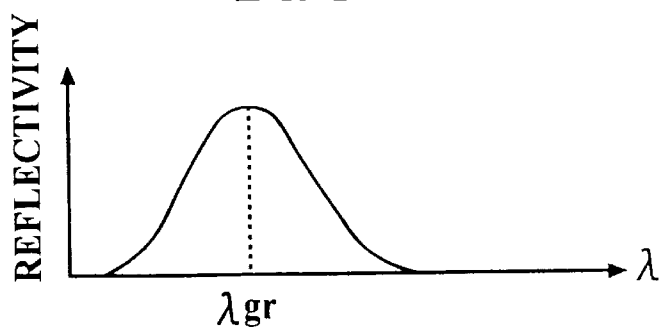
FIG. 7 is a view showing a characteristics of wavelength-reflectivity of the diffraction grating shown in FIG. 5.

FIG. 3B corresponds to an enlarged view of FIG. 2C. In this figure, transmittances for the first etalon (etalon 1) 8 and for the second etalon (etalon 2) 11 are illustrated by using the same axis for wavelength.

In the transmittance curve for the second etalon 11, although it is possible to distinguish between $\lambda_3$ or $\lambda_5$, and $\lambda_2$, $\lambda_4$ or $\lambda_6$, according to the slope (the rising or the falling) of the transmittance curve, it is not possible to distinguish among $\lambda_2$, $\lambda_4$ and $\lambda_6$. Therefore, in this case, shift from $\lambda_0$ to $\lambda_4$ should be reliably performed, not to incorrect $\lambda_2$ or $\lambda_6$. This is dependent on a detecting accuracy of the transmittance of 50% of the first etalon 8 which detects the origin $\lambda_0$ because the wavelength accuracy for the etalon is secured, as described later.

Because the detecting accuracy of transmittance of a level of ±5% is surely obtained, the wavelength range corresponding thereto is designed to be narrower than FSR2.

In FIG. 3B, the wavelength origin $\lambda_0$ is changed to, for example, a wavelength $\lambda_1$ having a transmittance of 40%. The wavelength $\lambda_1$ approximately corresponds to $\lambda_3$. This enables determination of $\lambda_1$ between $\lambda_2$–$\lambda_4$ securely furthermore. After detecting $\lambda_1$, when a wavelength scanning is carried out in the direction in which wavelength increases and thereby the first 50% point is found on the first falling of transmittance of the second etalon 11, the desired wavelength $\lambda_4$ can be obtained.

Because the resolving power of a general wavelength tunable LD light source is a level of 1 pm, it is possible to carry out a wavelength scanning easily while ascertaining peaks and valleys of the transmittance of the second etalon 11.

Next, wavelength accuracy will be explained.

The greatest factor of unstableness in a quartz solid etalon which has both end surfaces polished in parallel is the change of refractive index of the quartz according to temperature change, which is about $10^{-5}$. This shows that a temperature stability of about ±0.1° C. enables assurance of wavelength accuracy of ±0.001 nm.

It is easy to realize the temperature stability of about ±0.1° C. at a general environmental temperature of 0 to 40° C. by an automatic temperature control system using a thermistor or a Peltier cooling device. The greatest factor of unstableness in an air-gap etalon which is provided with parallel mirrors using a quartz spacer is a thermal expansion of the quartz spacer according to temperature rising, which is not more than $10^{-6}$. Therefore, this is advantageous furthermore.

For absolute value, although it is necessary to take into account the effect of chromatic dispersion on the refractive index when a wavelength scanning is carried out in a wide range in a solid etalon, there is no problem because wavelength at each transmittance is measured by using a precise wavemeter previously.

The fiber grating 6 is made of a material of quartz system and does not require temperature control. That is, because the wavelength error caused by a temperature change of about 0 to 40° C. is a level of ±0.2 nm and in consideration of it, FSR1 of the first etalon (etalon 1) 8 is set to be wide enough, it is not considered to detect an adjacent mode.

As described above, according to use of the fiber grating 6, the first etalon 8 and the second etalon 11, it is possible to carry out an optical wavelength setting while monitoring the output wavelength and to prevent the effect of error factors on the mechanism on the set wavelength.

That is, for example, a design described above enables assurance of a set wavelength accuracy having a level of about ±0.01 nm.

As described above, the wavelength tunable LD light source according to the embodiment of the invention is provided with an optical coupler, a fiber grating, first and second beam splitting devices, first second etalons, and first and second measuring units for etalon transmittance. Therefore, according to the embodiment, it is possible to obtain an advantageous effect of improvement of a wavelength accuracy having a level of about ±0.01 nm, without measuring to ascertain the wavelength of the light source output by a wavemeter every setting.

In the above embodiment, although each of the first and second measuring units compares the light intensity of transmitted beam through each etalon with the other of output beams from each beam splitting device to measure the transmittance of each etalon, in order to perform wavelength setting more precisely, such a comparing means is not essential to accomplish the object of the invention.

FIG. 4 is a block diagram for showing a construction of the wavelength tunable LD light source according to another embodiment of the invention. In FIG. 4, the same elements and the like as corresponding ones in FIG. 1 have the same reference numerals, and the detailed explanation for them will be omitted.

In FIG. 4, the reference numeral 15 denotes a first beam splitting device for receiving an output beam from the external resonator type of LD light source unit 1 as one input and produces branched two outputs. One of the two output beams branched at the first beam splitting device 15 is used as the output beam of the wavelength tunable LD light source and the other is inputted into a second beam splitting device 17. The second beam splitting device 17 splits the inputted light into two outputs. One of the two output lights splitted at the second beam splitting device 17 transmits an etalon 18 and thereafter inputs into a measuring unit 19 for the etalon transmittance. The other of the two output lights splitted at the second beam splitting device 17 inputs into the measuring unit 19 for etalon transmittance directly.

In the measuring unit 19 for the etalon transmittance, the transmitted light through the etalon 18 and the direct inputted light from the second beam splitting device 17 are measured, and the ratio of intensities, i.e., the transmittance of the etalon 18, is found. The result is sent to the control unit 4.

The reference numeral 23 denotes a wavemeter for specifying a wavelength of the output beam of the semiconductor laser source unit 1 with an accuracy in a free spectral range of the etalon 18, on the basis of the output beam of the semiconductor laser source unit 1. The specified wavelength by the wavemeter 23 is given to the control unit 4. The specification of wavelength can be carried out also by using information from the drive unit 3, with respect to wavelength to be set.

The control unit 4 gives an instruction to the drive unit 3 so that the data relating the specified wavelength from the wavemeter 23 and the transmittance data from the measuring unit 19 for etalon transmittance correspond to the wavelength origin and the position of wavelength to be set, on the basis of the relationship between etalon transmittance and wavelength which were measured and stored in advance.

As described above, according to a wavelength tunable LD light source having such a construction, it is possible to set a wavelength optically while monitoring the output wavelength, and therefore to prevent error factors on the mechanism from adverse effect to the set wavelength, and to assure a set wavelength accuracy having a level of about ±0.01 nm.

What is claimed is:

1. A semiconductor laser light source tunable in wavelength, comprising:
   an external resonator semiconductor laser source unit;
   an optical filter for selecting an output beam of the external resonator semiconductor laser source unit in a single mode;
   a drive unit for changing wavelength of a transmitted beam or of a reflected beam, from the optical filter;
   a control unit for controlling the drive unit;
   an optical coupler for receiving the output beam of the external resonator semiconductor laser source unit as one of incident beams and for outputting it into two branches;
   a fiber grating for receiving an output beam from the optical coupler;
   a first etalon for receiving a reflected beam from the fiber grating through the optical coupler;
   a first measuring unit for etalon transmittance, for measuring a transmittance of the first etalon to transmit to the control unit;
   a second etalon for receiving the other of the two branched output beams of the optical coupler; and
   a second measuring unit for etalon transmittance, for measuring a transmittance of the second etalon to transmit to the control unit.

2. A semiconductor laser light source tunable in wavelength as claimed in claim 1, further comprising:
   a first beam splitting device for receiving the reflected beam from the fiber grating through the optical coupler and for outputting it into two branches, one of which is output to the first etalon and the other is output to the first measuring unit for etalon transmittance, so that the first measuring unit for etalon transmittance compares a light intensity of transmitted beam through the first etalon with the other of output beams from the first beam splitting device to measure the transmittance of the first etalon; and
   a second beam splitting device for receiving the other of the two branched output beams of the optical coupler and for outputting it into two branches, one of which is output to the second etalon and the other is output to the second measuring unit for etalon transmittance, so that the second measuring unit for etalon transmittance compares a light intensity of transmitted beam through the second etalon with the other of output beams from the second beam splitting device to measure the transmittance of the second etalon.

3. A semiconductor laser light source tunable in wavelength as claimed in claim 1, wherein the first etalon comprises an interference filter.

4. A semiconductor laser light source tunable in wavelength as claimed in claim 1, wherein the first etalon has a free spectral range which is wider than a full width at half maximum of a reflection curve of the fiber grating.

5. A semiconductor laser light source t unable in wavelength as claimed in claim 1, wherein a facet of the first etalon has a reflectivity not less than 90%.

6. A semiconductor laser light source tunable in wavelength, comprising:

an external resonator semiconductor laser source unit;

an optical filter for selecting an output beam of the external resonator semiconductor laser source unit in a single mode;

a drive unit for changing wavelength of a transmitted beam or of a reflected beam, from the optical filter; and a control unit for controlling the drive unit;

a first beam splitting device for receiving the output beam of the external resonator semiconductor laser source unit as one of incident beams and for outputting it into two branches;

an etalon for receiving one of output beams from the first beam splitting device;

a measuring unit for etalon transmittance, for measuring a transmittance of the etalon to transmit it to the control unit; and a wavemeter for specifying a wavelength of the output beam of the semiconductor laser source unit with an accuracy in a free spectral range of the etalon, on the basis of the output beam of the semiconductor laser source unit or on the basis of information from the drive unit, to output the specified wavelength to the control unit.

7. A semiconductor laser light source tunable in wavelength as claimed in claim 6, further comprising:

a second beam splitting device for receiving the one of output beams from the first beam splitting device and for outputting it into two branches, one of which is output to the etalon and the other is output to the measuring unit for etalon transmittance, so that the measuring unit for etalon transmittance compares a light intensity of transmitted beam through the etalon with the other of output beams from the second beam splitting device to measure the transmittance of the etalon.

* * * * *